(12) United States Patent
Dong et al.

(10) Patent No.: US 7,037,785 B2
(45) Date of Patent: May 2, 2006

(54) METHOD OF MANUFACTURING FLASH MEMORY DEVICE

(75) Inventors: Cha Deok Dong, Ichon-shi (KR); Ho Min Son, Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 220 days.

(21) Appl. No.: 10/618,978

(22) Filed: Jul. 14, 2003

(65) Prior Publication Data

US 2004/0126972 A1 Jul. 1, 2004

(30) Foreign Application Priority Data

Dec. 26, 2002 (KR) .................. 10-2002-0084331

(51) Int. Cl.
*H01L 21/336* (2006.01)

(52) U.S. Cl. .................. 438/259; 438/201; 438/257; 438/435; 257/279; 257/546

(58) Field of Classification Search .................. 438/201, 438/257, 259, 435; 257/279, 546
See application file for complete search history.

(56) References Cited

U.S. PATENT DOCUMENTS 6,465,293 B1 * 10/2002 Park et al. .................. 438/214
6,607,925 B1 * 8/2003 Kim et al. .................. 438/4
6,649,965 B1 * 11/2003 Takada et al. .............. 257/314

FOREIGN PATENT DOCUMENTS

JP 2000-174242 6/2000
JP 2002-083884 3/2002

OTHER PUBLICATIONS

Office Action isued by Korean Intellectual Property Office dated Oct. 26, 2004.

* cited by examiner

*Primary Examiner*—Michael Tran
*Assistant Examiner*—Renee R. Berry
(74) *Attorney, Agent, or Firm*—Marshall, Gerstein & Borun LLP

(57) ABSTRACT

Disclosed is a method of manufacturing the flash memory device. The method comprises the steps of sequentially forming a tunnel oxide film, a first polysilicon film and a hard mask film on a semiconductor substrate, etching portions of the hard mask film, the first polysilicon film, the tunnel oxide film and the semiconductor substrate through a patterning process to form a trench within the semiconductor substrate, depositing an oxide film to bury the trench and then polishing the oxide film by means of a chemical mechanical polishing process until the hard mask film is exposed, removing the hard mask film, implementing a cleaning process so that a protrusion of the oxide film is recessed to an extent that the sidewall bottom of the first polysilicon film is not exposed, depositing a second polysilicon film on the results in which the protrusion of the oxide film is recessed and then polishing the second polysilicon film until the protrusion of the oxide film is exposed, forming a dielectric film on the second polysilicon film, and forming a control gate on the dielectric film.

12 Claims, 6 Drawing Sheets

METHOD OF MANUFACTURING FLASH MEMORY DEVICE

BACKGROUND

1. Technical Field

Figure 1:
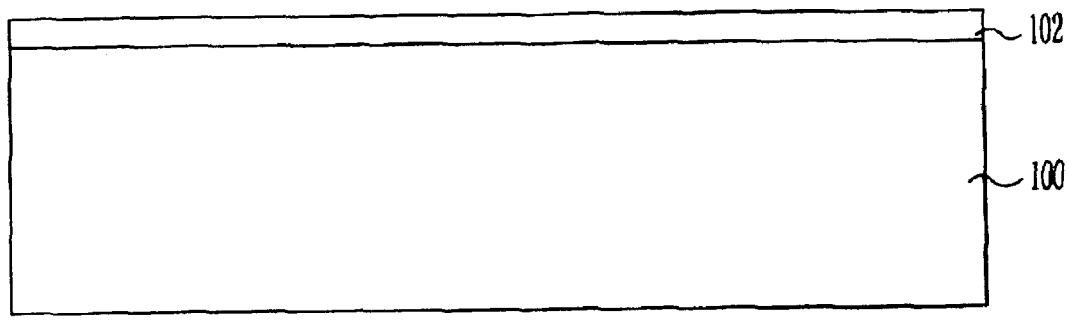

Methods of manufacturing flash memory devices are disclosed.

2. Background of the Related Art

In implementing the flash memory devices, shallow trench isolation (hereinafter called 'STI') is employed. In the prior art, as the sidewall oxidization process is employed, a tunnel oxide film formed at the top corner of the trench is formed in thickness thinner than a deposition target. The thickness of the tunnel oxide film formed at the top corner of the trench becomes thinner than that of the tunnel oxide film formed at its center. Furthermore, in order to sufficiently reduce the critical dimension (hereinafter called 'CD') in the active region, a photolithography technology of a micro line width is required. For this, expensive equipments are required and the cost price is thus increased. In addition, there are limitations in increasing the surface area of the floating gate and the capacitance value applied to the ONO (oxide/nitride/oxide) film being the dielectric film. Accordingly, it is difficult to expect an increase in the coupling ratio.

Furthermore, in manufacturing the flash memory device, a mask CD is changed and the uniformity of the wafer is poor, in a patterning process for isolating the floating gate. For this reason, it is not easy to implement a uniform floating gate. Accordingly, the coupling ratio is varied and fail occurs in a program or erase operation. Moreover, a mask work becomes more difficult in implementing a spacer of below 0.10 μm in view of a higher-integrated design.

Meanwhile, if the floating gate is not uniformly formed, the difference in the coupling ratio is severe. Accordingly, an over-erase problem occurs in the program or erase operation of the cell, which adversely affects the characteristics of the device. Also, this causes to lower the yield and to increase the cost price due to an increased number of a mask process.

Incidentally, a device fail, etc. occurs due to a moat occurring in the STI or LOCOS process (indicating a shape that the field oxide film around the active region becomes depressed). In view of the above, it is an important problem that must be solved in a high-integrated flash memory device to secure a cell having no moat and increase the coupling ratio.

SUMMARY OF THE DISCLOSURE

Accordingly, the disclosed methods for manufacturing flash memory devices substantially obviate one or more problems due to limitations and disadvantages of the related art.

One disclosed method of manufacturing flash memory device is capable of sufficiently reducing the critical dimension of the active region, increasing the surface area of the floating gate, implementing a uniform and flat floating gate and prohibiting generation of a moat.

One disclosed method of manufacturing flash memory device comprises: (a) sequentially forming a tunnel oxide film, a first polysilicon film and a hard mask film on a semiconductor substrate, (b) etching the hard mask film, the first polysilicon film, the tunnel oxide film and the semiconductor substrate through a patterning process to form a trench within the semiconductor substrate, (c) depositing an oxide film to bury the trench and then polishing the oxide film by means of a chemical mechanical polishing process until the hard mask film is exposed, (d) removing the hard mask film, (e) implementing a cleaning process so that a protrusion of the oxide film is recessed to an extent that the sidewall bottom of the first polysilicon film is not exposed, (f) depositing a second polysilicon film on the results in which the protrusion of the oxide film is recessed and then polishing the second polysilicon film until the protrusion of the oxide film is exposed, (g) forming a dielectric film on the second polysilicon film, and (h) forming a control gate on the dielectric film.

It is to be understood that both the foregoing general description and the following detailed description of the disclosed embodiments are intended to be exemplary, explanatory and to provide further explanation of the disclosed methods as recited in the claims.

The above and other advantages of the disclosed methods will be apparent from the following detailed description of the preferred embodiments in conjunction with the accompanying drawings, wherein:

FIG. 1~FIG. 11 are cross-sectional views of flash memory devices for explaining the disclosed methods for manufacturing flash memory devices.

DETAILED DESCRIPTION OF THE PRESENTLY PREFERRED EMBODIMENTS

Reference will now be made in detail to the preferred embodiments, the disclosed examples of which are illustrated in the accompanying drawings, in which like reference numerals are used to identify the same or similar parts. FIG. 1~FIG. 11 are cross-sectional views of flash memory devices for explaining the disclosed methods for manufacturing flash memory devices.

Referring to FIG. 1, a semiconductor substrate 100 the top surface of which is cleaned through a pre-treatment cleaning process is prepared. At this time, it is preferable that the pre-treatment cleaning process is implemented using DHF (diluted HF; solution where $H_2O$ is mixed in a given ratio) and SC-1(standard cleaning-1; solution where $NH_4OH/H_2O_2/H_2O$ solutions are mixed in a given ratio), or BOE (buffer oxide etchant; solution where $HF/NH_4F/H_2O$ solutions are mixed in a given ratio) and SC-1.

For the purpose of prohibiting crystal defects on the top surface of the semiconductor substrate 100 or surface process on it, a sacrificial oxide film 102 is formed on the semiconductor substrate 100. It is preferred that the sacrificial oxide film 102 is formed in a dry or wet oxidization mode and is formed in thickness of 70 Å~100 Å at a temperature of about 750° C.~800° C.

Ion implantation for forming wells and controlling the threshold voltage is implemented using the sacrificial oxide film 102 as a buffer layer. Ion implantation for forming the wells is implemented using a high energy. Ion implantation for controlling the threshold voltage is implemented using an energy lower than the energy used in ion implantation for forming the wells.

Figure 2:
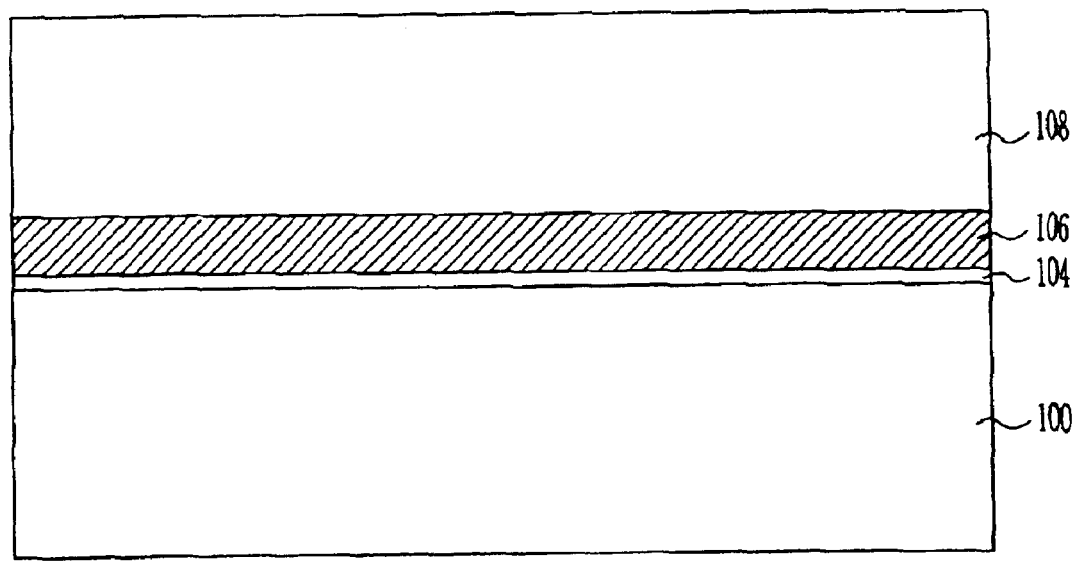

By reference to FIG. 2, the sacrificial oxide film 102 is removed. At this time, the sacrificial oxide film 102 may be removed using DHF and SC-1.

A tunnel oxide film 104 is formed on the results from which the sacrificial oxide film 102 is removed. It is preferable that the tunnel oxide film 104 is formed using a wet oxidization mode. For instance, the tunnel oxide film 104 may be formed by implementing wet oxidization at a temperature of about 750° C.~800° C. and implementing annealing under nitrogen ($N_2$) atmosphere at a temperature of 900° C.~910° C. for 20~30 minutes.

A first polysilicon film 106 to be used as a floating gate is deposited on the tunnel oxide film 104. The first polysilicon film 106 is formed by means of a low pressure-chemical vapor deposition (LP-CVD) method using a $SiH_4$ or $Si_2H_6$ gas. At this time, it is preferred that the first polysilicon film 106 is formed using an amorphous silicon film into which a dopant is not doped. Furthermore, it is preferred that the first polysilicon film 106 is formed in thickness of about 250~500 Å at a temperature of about 480~550° C. and a low pressure of about 0.1~3 Torr.

A hard mask film 108 is formed on the first polysilicon film 106. The hard mask film 108 is formed using a silicon nitride film having an etch selectivity ratio to a trench oxide film (see '114' in FIG. 5). Furthermore, the hard mask film 108 is deposited by the LP-CVD method and is formed in thickness through which a protrusion of a trench oxide film 114 formed by a subsequent process is sufficiently protruded, for example, in thickness of about 1200~3500 Å.

Figure 3:
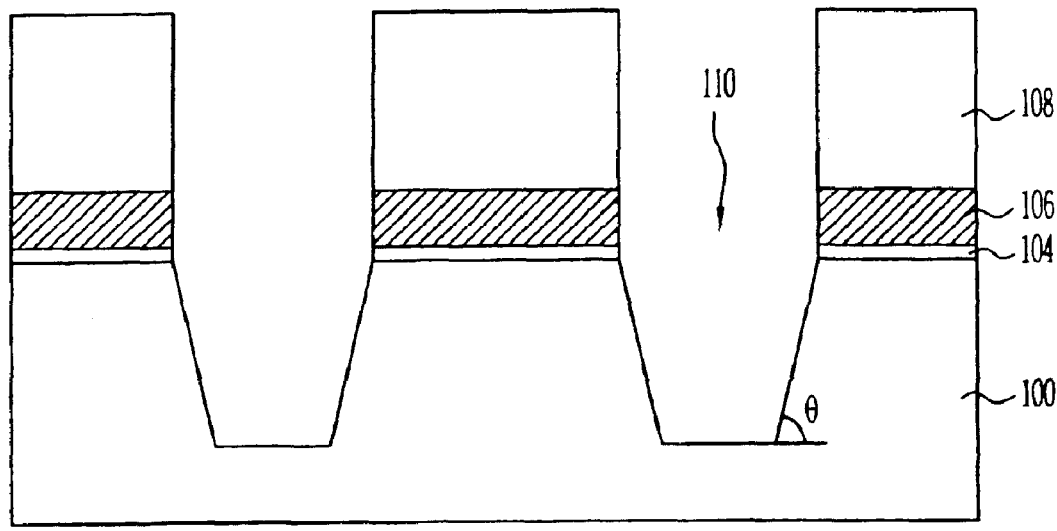

Turning to FIG. 3, a trench 110 is formed into the semiconductor substrate 100 through patterning for forming an isolation film, thereby defining an isolation region and an active region. In the concrete, a photoresist pattern (not shown) defining the isolation region is formed. The hard mask film 108, the first polysilicon film 106, the tunnel oxide film 104 and the semiconductor substrate 100 are etched using the photoresist pattern as an etch mask, thus forming the trench 110. At this time, the trench 110 formed within the semiconductor substrate 100 is formed to have a slope ($\theta$) of a given angle. For instance, the trench 110 may be formed to have a slope of 75°~88°.

A cleaning process is implemented in order to remove a native oxide film formed on the sidewall of the trench 110. The cleaning process may employ DHF and SC-1, or BOE and SC-1.

Figure 4:
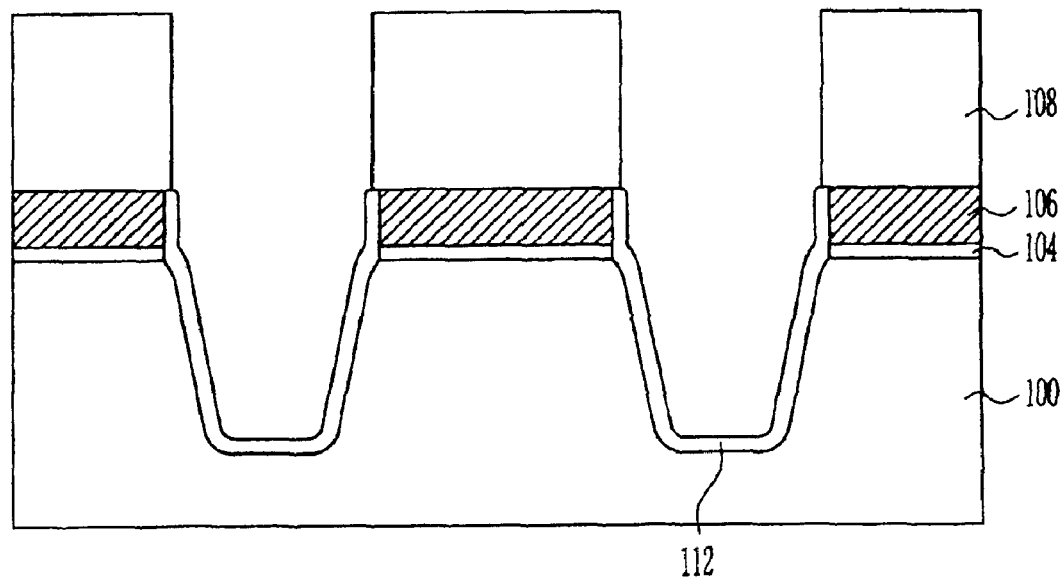

With reference to FIG. 4, in order to compensate for etch damage at the sidewall and bottom of the trench 110, make rounded the top and bottom corners of the trench 110 and reduce the CD in the active region, sidewall oxide films 112 are formed on the inner wall of the trench 110. At this time, it is preferred that the sidewall oxide films 112 are formed in a dry or wet oxidization mode and are formed in thickness of about 50~150 Å at a temperature of 750~1150° C.

Figure 5:
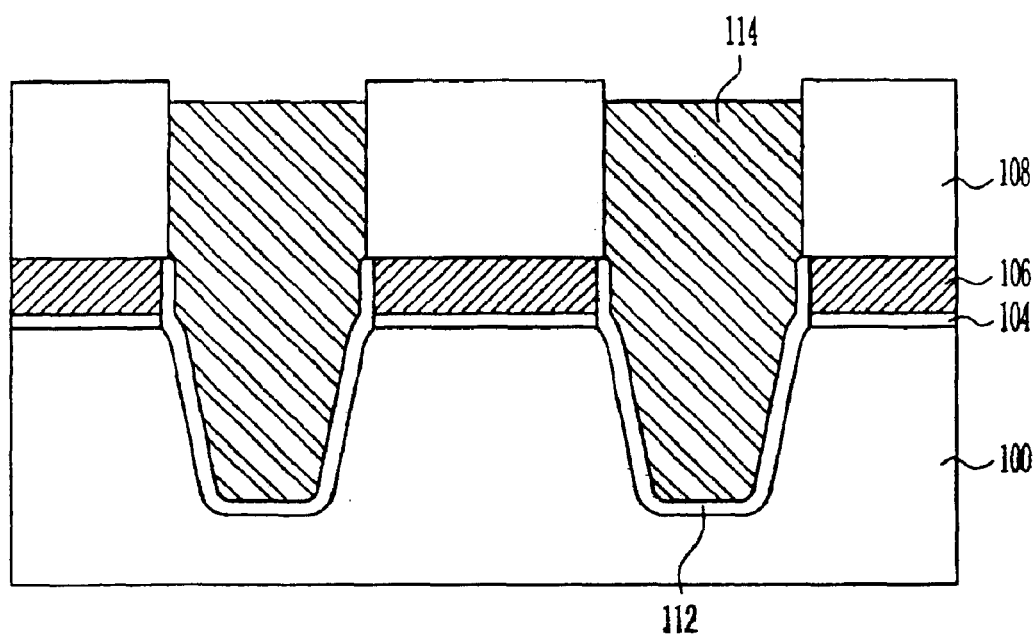

Referring to FIG. 5, a trench oxide films 114 is deposited to bury or fill the trench 110. At this time, the trench oxide film 114 is deposited in thickness that is sufficiently deposited up to the top surface of the hard mask film 108 while burying or filling the trench 110, for example, in thickness of about 5000 Å–10000 Å. It is preferred that the trench oxide film 114 is formed using a HDP (high density plasma) oxide film. The trench oxide film 114 is formed is buried so that void, etc. is not formed within the trench 110.

Thereafter, the trench oxide film 114 is polished by a chemical mechanical polishing process. It is preferred that the chemical mechanical polishing process is implemented until the hard mask film 108 is exposed.

After the chemical mechanical polishing process, a cleaning process is implemented to remove the trench oxide film 114 remaining on the hard mask film 108. It is preferred that the cleaning process employs a BOE or HF solution and is controlled so that the trench oxide film 114 between the hard mask films 108 is not excessively recessed.

Figure 6:
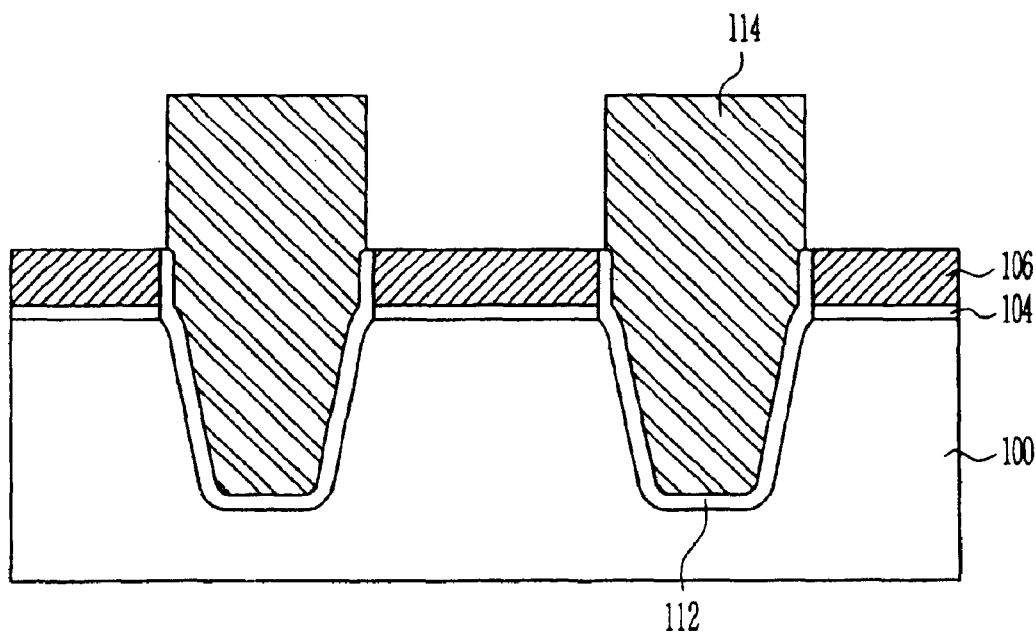

By reference to FIG. 6, the hard mask film 108 is removed. The hard mask film 108 may be removed using a strip process. For example, the hard mask film 108 may be removed using a phosphoric acid ($H_3PO_4$) solution.

Figure 7:
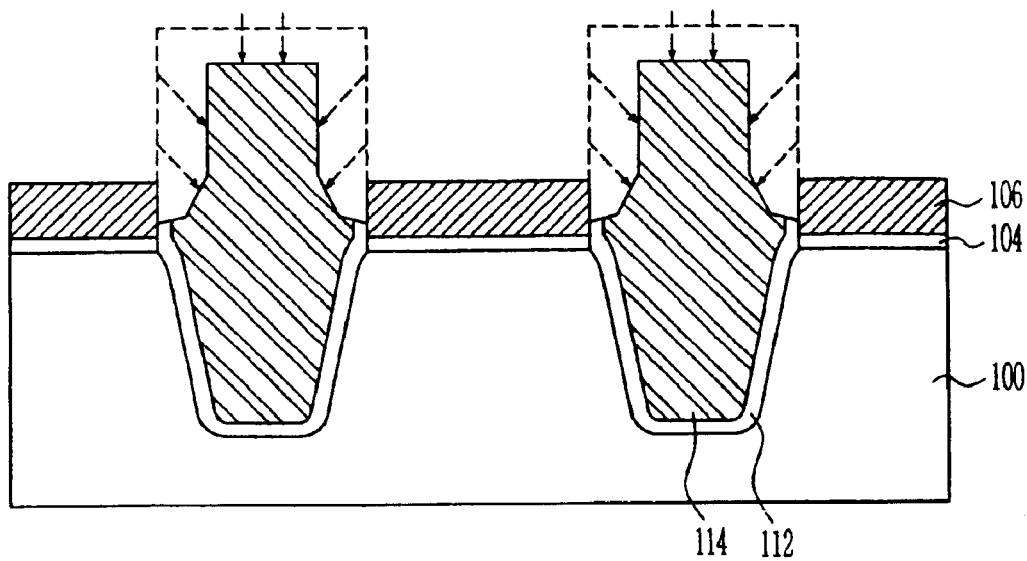

With reference to FIG. 7, before a second polysilicon film (see '116' in FIG. 8) is deposited, the native oxide film formed on the first polysilicon film 106 is removed by means of a cleaning process using DHF and SC-1. The trench oxide film 114 is recessed by some degree and a desired space between the floating gates could be obtained, by means of the cleaning process. Further, it is preferred that the cleaning process is controlled so that the bottom of the sidewall of the first polysilicon film 106 is not exposed and a moat does not occur.

Figure 8:
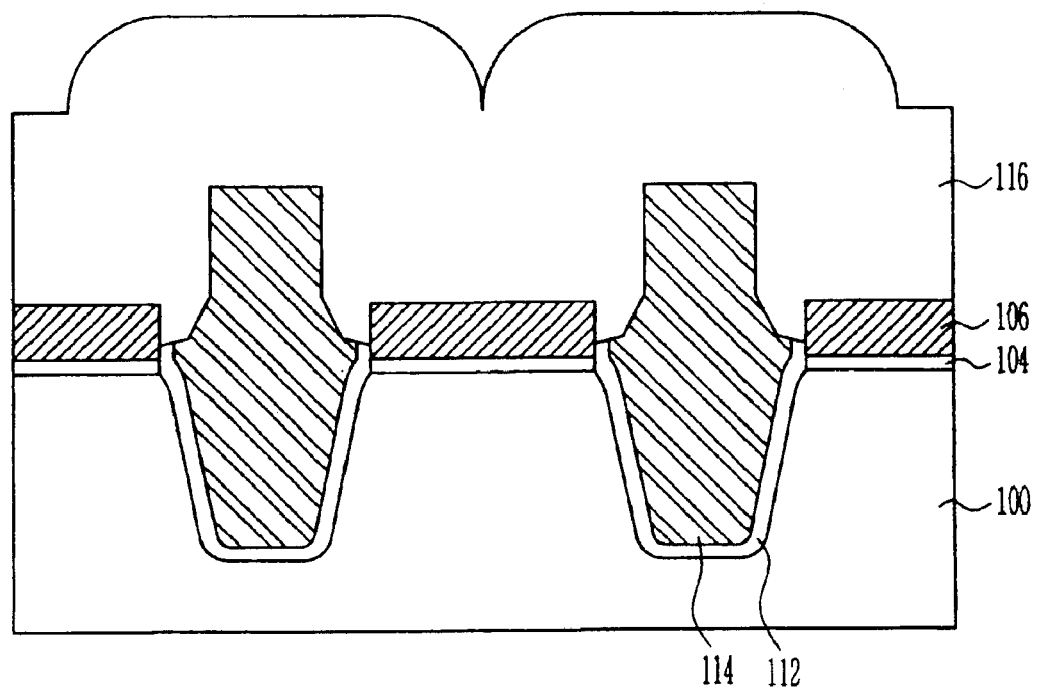

Referring to FIG. 8, a second polysilicon film 116 is deposited. The second polysilicon film 116 is formed by means of the LP-CVD (low pressure-chemical vapor deposition) method using a $SiH_4$ or $Si_2H_6$ gas and a $PH_3$ gas. It is preferred that the second polysilicon film 116 is formed using a polysilicon film into which a dopant is doped. At this time, the doped dopant may be phosphorous (P), etc. It is preferred that phosphorous (P) is doped at the dose of about 1.0 E20~3.0 E20 atoms/cc. Furthermore, it the second polysilicon film 116 is formed in thickness of about 1000~2000 Å at a temperature of about 550~620° C. under a low pressure of about 0.1~3 Torr.

Figure 9:
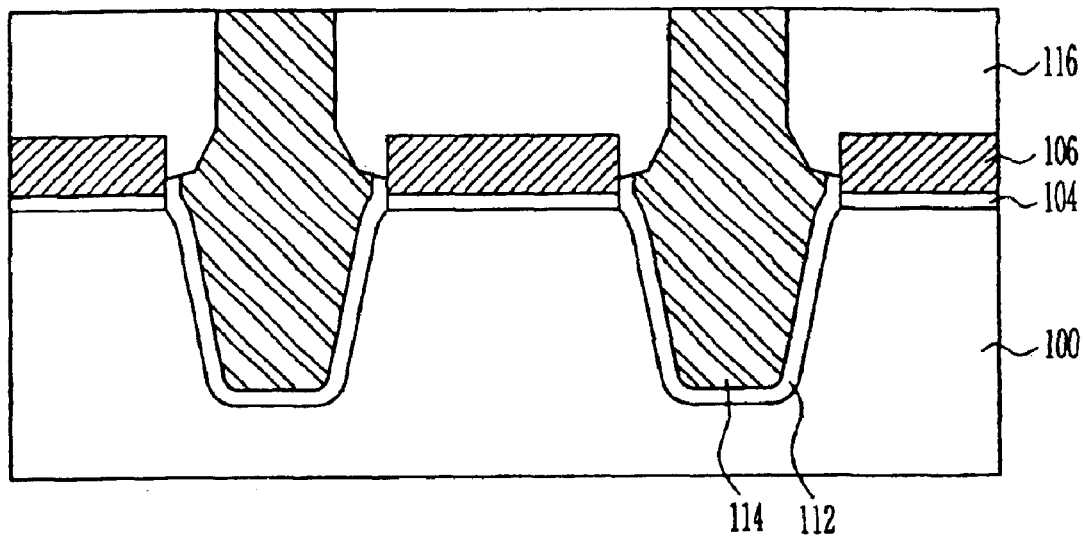

By reference to FIG. 9, the second polysilicon film 116 is polished by the chemical mechanical polishing until the trench oxide film 114 is exposed. By the polishing process, the second polysilicon film 116 is isolated by the trench oxide film 114.

Figure 10:
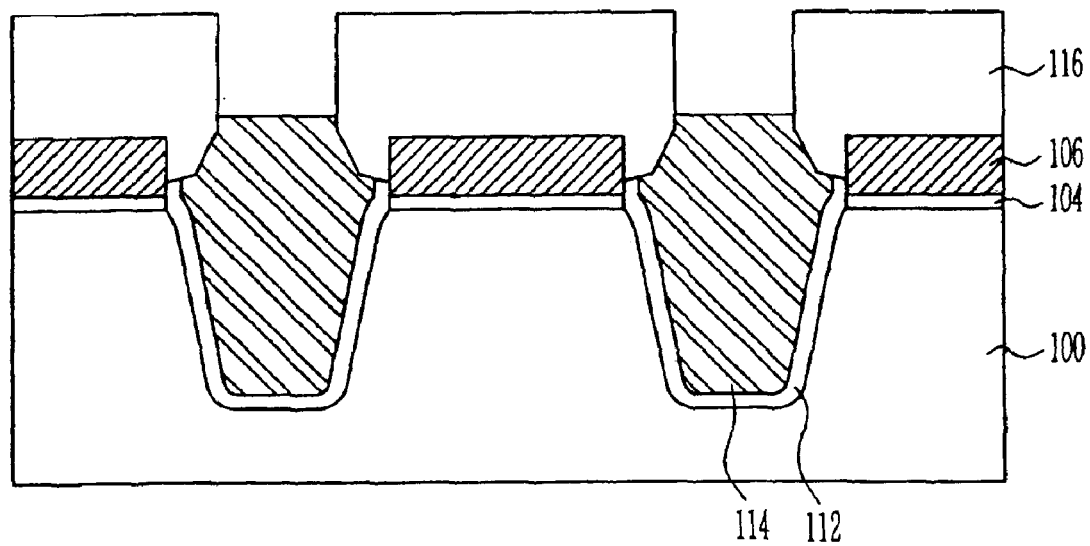

Turning to FIG. 10, a cleaning process is implemented to etch the trench oxide film 114 protruded between the second polysilicon films 116 by a desired target. It is preferable that the cleaning process employs DHF or BOE. Thereby, the exposed area of the second polysilicon film 116 is increased while the sidewall of the second polysilicon film 116 contacting the protrusion of the trench oxide film 114, so that the coupling ratio could be increased.

Figure 11:
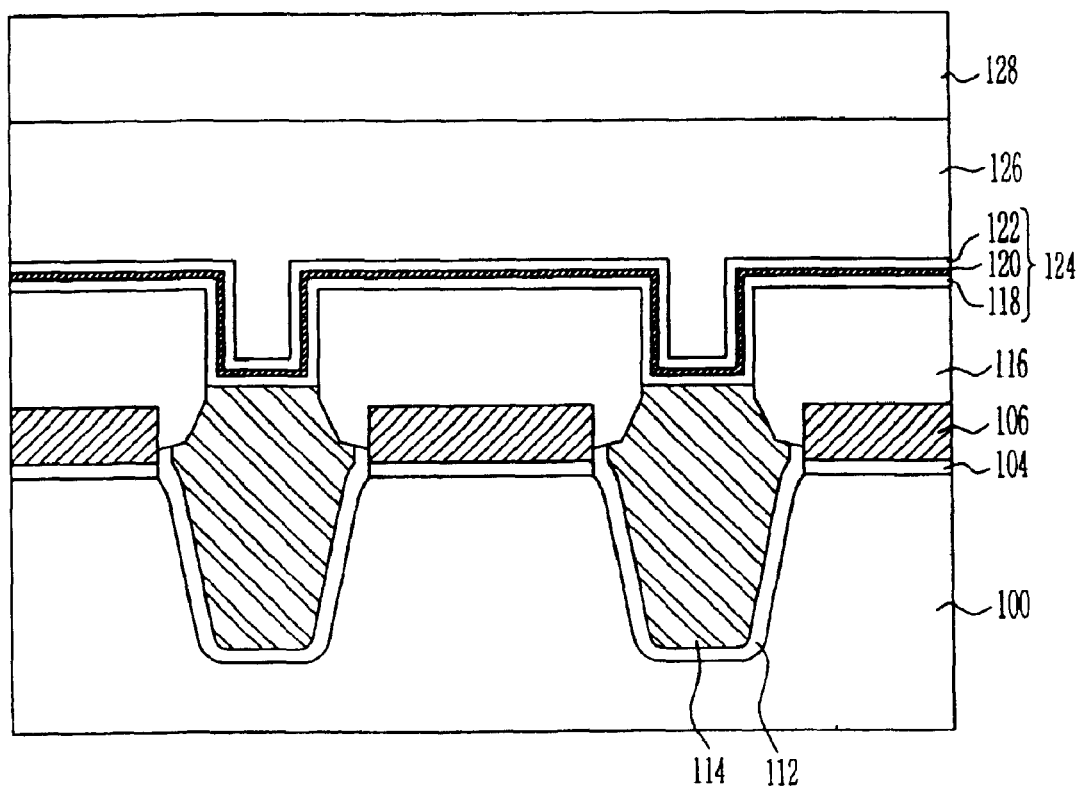

With reference to FIG. 11, a dielectric film 124 is formed on the second polysilicon film 116 and the trench oxide film 114. It is preferred that the dielectric film 124 is formed to have a structure of an oxide film/nitride film/oxide film, i.e., the ONO ($SiO_2/Si_3N_4/SiO_2$) structure. The oxide ($SiO_2$) films 118 and 122 of the dielectric film 124 may be formed using high temperature oxide (HTO) using $SiH_2Cl_2$ (dichlorosilane; DCS) and $H_2O$ gas as a source gas. For instance, the oxide films 118 and 122 of the dielectric film 124 may be formed by means of the LP-CVD method under a low pressure of 0.1~3 Torr at a temperature of about 810~850° C. using $H_2O$ and $SiH_2Cl_2$ (dichlorosilane; DCS) gas as a reaction gas. Furthermore, the nitride film 120 of the dielectric film 124 may be formed by means of the LP-CVD method under a low pressure of about 0.1~3 Torr at a temperature of about 650~800° C. using $NH_3$ and $SiH_2Cl_2$ (dichlorosilane; DCS) gas as a reaction gas. It is preferred that the first oxide film 118 is formed in thickness of about 35~60 Å, the nitride film 120 is formed in thickness of about 50~65 Å and the second oxide film 122 is formed in thickness of about 35~60 Å.

Next, in order to improve the film quality of the ONO film and enhance the interface between the respective layers, a steam anneal process is implemented in a wet oxidization mode at a temperature of about 750~800° C. It is preferred that the process of forming the dielectric film 124 and the steam anneal process are implemented with no time delay between the respective processes in order to prevent contamination by the native oxide film or the impurities.

A third polysilicon film 126 to be used as a control gate is formed on the results on which the dielectric film 124 is formed. It is preferred that the third polysilicon film 126 is formed using an amorphous polysilicon film at a temperature of about 510~550° C. and a low pressure of about 0.1~3 Torr. Furthermore, it is preferred that the third polysilicon film 126 is formed to have a dual structure on which a film into which a dopant is doped and a film into which a dopant is not doped are sequentially stacked, in order to prevent diffusion of fluorine (F) that may be substitutionally solidified into the dielectric film 124 to increase the thickness of the oxide film and prohibit formation of an abnormal film such as $WP_x$, etc. It is preferred that the thickness of the film into which the dopant is doped is about 1/3~6/7 of a total thickness (film into which the dopant is doped and film into which the dopant is not doped). The doped amorphous polysilicon film is formed by means of the LP-CVD method using a Si source gas such as $SiH_4$ or $Si_2H_6$ and a $PH_3$ gas. The undoped amorphous polysilicon film is formed by means of an in-situ process immediately after supply of $PH_3$ gas is stopped. The third polysilicon film 126 is formed in thickness of about 500~1000 Å.

Thereafter, a silicide film 128 is formed on the third polysilicon film 126. At this time, it is preferred that the silicide film 128 is formed using a tungsten silicon (WSi) film. Furthermore, it is preferred that the tungsten silicon (WSi) film being the silicide film 128 is formed at a temperature between 300° C.~500° C. using a reaction of $SiH_4$ (monosilane; MS) or $SiH_2Cl_2$ (dichlorosilane; DCS) and $WF_6$ in order to obtain a low content of fluorine (F), a low stress after annealing, and a good adhesive strength. Also, it is preferred that the tungsten silicon (WSi) film is grown at the stoichiometry ratio of about 2.0~2.8 in order to implement an adequate step coverage and minimize the sheet resistance(Rs).

Next, an anti-reflective coating film (not shown) is formed on the silicide film 128. The anti-reflective coating film may be formed using $SiO_xN_y$ or $Si_3N_4$.

Then, a gate patterning process is implemented. In other words, the anti-reflective coating film, the silicide film 128, the third polysilicon film 126 and the dielectric film 124 are patterned using a mask for forming a control gate. The second polysilicon film 116 and the first polysilicon film 106 are then patterned by means of a self-aligned etch process using the patterned anti-reflective coating film.

As described above, conventionally, there was a phenomenon that the thickness of the gate oxide film adjacent to the top corner of the trench is thinner than that of the center of the gate oxide film. On the contrary, the disclosed techniques can prevent such phenomenon by applying the self-aligned STI technology. Furthermore, the disclosed methodology has advantageous effects that it can improve electrical characteristics such as retention fail, fast erase, etc. of the device since an active region so much as a desired CD could be obtained, and improve reliability of the device. Also, a uniform tunnel oxide film within a channel width could be kept by preventing the tunnel oxide film from being attacked. Therefore, the disclosed methods can improve characteristics of the device.

Furthermore, the disclosed methods can effectively secure the coupling ratio and easily secure a sufficient process margin, by freely adjusting the surface area of the floating gate.

In addition, the has disclosed methods can easily implement a flash memory device having a space of below 0.1 µm in size, by use of a self-aligned floating gate process technology. Also, the present invention has new effects that it can minimize variation in the CD without resorting to the conventional method used in the mask process and the etch process, and implement a uniform floating gate over the entire wafer.

Also, the disclosed methods can form a trench structure having no moat.

Incidentally, the disclosed methods are effective in improving retention characteristics since the interface with the ONO dielectric film is stable, by processing the second polysilicon film using a chemical mechanical polishing process.

Additionally, the disclosed methods can implement a flash memory device of a high reliability with a low cost, by using existing equipments and processes without using complex processes and additional equipments.

In the above description, it was described that one layer exists on the other layer. However, those having skill in the art will appreciate that one layer may exist immediately on the other layer and a third layer may be intervened between them.

The forgoing embodiments are merely exemplary and not to be construed as limiting the present invention. The present teachings can be readily applied to other types of apparatuses. The description of the disclosed methods is intended to be illustrative, and not to limit the scope of the claims. Many alternatives, modifications, and variations will be apparent to those skilled in the art.

What is claimed is:

1. A method of manufacturing flash memory device, comprising:

(a) sequentially forming a tunnel oxide film, a first polysilicon film and a hard mask film on a semiconductor substrate;

(b) etching the hard mask film, the first polysilicon film, the tunnel oxide film and the semiconductor substrate through a patterning process to form a trench within the semiconductor substrate;

(c) depositing an oxide film to bury the trench and then polishing the oxide film by means of a chemical mechanical polishing process until the hard mask film is exposed;

(d) removing the hard mask film;

(e) implementing a cleaning process so that the oxide film is recessed to an extent that a portion of a sidewall of the first polysilicon film is exposed but so that the bottom portion of the sidewall of the first polysilicon film is not exposed and remains covered by the oxide film;

(f) depositing a second polysilicon film on the resultant structure and then polishing the second polysilicon film until the oxide film is exposed;

(g) forming a dielectric film on the second polysilicon film; and (h) forming a control gate on the dielectric film.

2. The method as claimed in claim 1, further comprising the steps of: before the tunnel oxide film is formed on the semiconductor substrate, forming a sacrificial oxide film on the semiconductor substrate;

implementing ion implantation for forming wells and iop implantation for controlling the threshold voltage, using the sacrificial oxide film as a buffer layer; and removing the sacrificial oxide film.

3. The method as claimed in claim 1, further comprising the step of before the step (g) after the step (f), implementing a cleaning process for recessing the oxide film between the second polysilicon films by a given depth in order to increase a contact surface area of the second polysilicon film and the dielectric film.

4. The method as claimed in claim 1, wherein the hard mask film is formed using a silicon nitride film having an etch selectivity ratio to the oxide film and is formed in thickness through which the oxide film is protruded sufficiently higher than the surface of the semiconductor substrate.

5. The method as claimed in claim 1, wherein the oxide film is a HDP oxide film and is deposited in thickness that could be deposited higher than the top surface of the hard mask film while completely burying the trench.

6. The method as claimed in claim 1, wherein, the cleaning process for recessing the protrusion of the oxide film employs DHF and SC-1 solution.

7. The method as claimed in claim 1, wherein the first polysilicon film is formed using an amorphous polysilicon film into which a dopant is not doped and wherein the amorphous polysilicon film is formed by means of a low pressure-chemical vapor deposition (LP-CVD) method using $SiH_4$ or $Si_2H_6$ gas at a temperature of 480~550° C. and a low pressure of 0.1~3 Torr.

8. The method as claimed in claim 1, wherein the second polysilicon film is formed by means of a low pressure-chemical vapor deposition (LP-CVD) method using $SiH_4$ or $Si_2H_6$ gas and $PH_3$ gas at a temperature of 550~620° C. and a low pressure of 0.1~3 Torr.

9. The method as claimed in claim 1, wheirein the control gate is formed to have a dual structure on which a film into which a dopant is doped and a film into which a dopant is not doped are sequentially stacked, in order to prevent diffusion of fluorine (F) that may be substitutionally solidified into a dielectric film to increase the thickness of the oxide film.

10. The method as claimed in claim 9, wherein the amorphous polysilicon film into which the dopant is doped is formed by a low pressvre-chemical vapor deposition (LP-CVD) method using $SiH_4$ or $Si_2H_6$ gas and a $PH_3$ gas at a temperature of 510~550° C. and pressure of 0.1~3 Torr and the amorphous polysilicon film into which the dopant is not doped by an in-situ process after supply of the $PH_3$ gas is stopped.

11. The method as claimed in claim 1, wherein the dielectric film is formed to have a stack structure on which an oxide film, a nitride film and an oxide film are sequentially stacked.

12. The method as claimed in claim 11, further comprising the step of before the step (h) after the step (g), implementing a steam anneal process at a temperature of 750~800° C. in order to improve the film quality of the dielectric film and enhance the interface between the stack structure of the oxide film, the nitride film and the oxide film.

* * * * *